United States Patent
Sakaino et al.

[11] Patent Number: 5,909,523
[45] Date of Patent: Jun. 1, 1999

[54] OPTICAL MODULE AND METHOD OF FABRICATING OPTICAL MODULE

[75] Inventors: Go Sakaino; Katsuhiko Goto; Toshitaka Aoyagi, all of Tokyo, Japan

[73] Assignee: Mitsubishi Denki Kabushiki Kaisha, Tokyo, Japan

[21] Appl. No.: 08/816,934

[22] Filed: Mar. 14, 1997

[30] Foreign Application Priority Data

Sep. 6, 1996 [JP] Japan .................................... 8-236430

[51] Int. Cl.⁶ ........................................................ G02B 6/30
[52] U.S. Cl. ........................... 385/49; 385/88; 385/129; 385/52; 257/93; 257/99; 359/152; 359/180; 156/293
[58] Field of Search ................................. 385/49, 50, 52, 385/88–94, 129; 257/93, 99; 359/152, 180; 156/293

[56] References Cited

U.S. PATENT DOCUMENTS

| | | | |
|---|---|---|---|
| 5,420,953 | 5/1995 | Boudreau et al. | 385/88 |
| 5,675,684 | 10/1997 | Hirataka et al. | 385/88 |

FOREIGN PATENT DOCUMENTS

| | | |
|---|---|---|
| 2149805 | 6/1990 | Japan . |
| 743565 | 2/1995 | Japan . |

OTHER PUBLICATIONS

Nosaka et al, "PD Module With Pre-Amplifier On A Si Platform", Extended Abstracts, 1996 General Meeting of Institute of Electronic Information Communication, p. 219.

Primary Examiner—Phan T. H. Palmer
Attorney, Agent, or Firm—Leydig, Voit & Mayer, Ltd.

[57] ABSTRACT

An optical module includes a substrate having an upper surface and a groove on the upper surface; an optical fiber having a core and an end facet, disposed in the groove of the substrate; an optical semiconductor device having an upper surface and a light interactive area on the upper surface optically coupled to the optical fiber; and a block having a side surface on which the optical semiconductor device is fixed and a lower surface perpendicular to the side surface. The optical semiconductor device is fixed onto the side surface of the block so that the distance from the light interactive area to the lower surface of the block is equal to the distance from the core of the optical fiber to the upper surface of the substrate; and the block is disposed on the substrate, with the lower surface contacting the upper surface of the substrate, so that the light interactive area is opposed to the end facet of the optical fiber. The core of the optical fiber and the light interactive area are accurately aligned with the surface of the substrate as a reference regardless of the thickness of the substrate, resulting in a high coupling efficiency between the optical fiber and the optical semiconductor device.

8 Claims, 12 Drawing Sheets

OPTICAL MODULE AND METHOD OF FABRICATING OPTICAL MODULE

FIELD OF THE INVENTION

The present invention relates to an optical module in which an optical fiber or an optical waveguide is optically coupled with an optical semiconductor device, employed in an optical transmitter or receiver. More specifically, the invention relates to an optical module that secures high accuracy in positioning the optical semiconductor device.

BACKGROUND OF THE INVENTION

A typical optical module in which an optical fiber and a laser diode are optically coupled with each other is disclosed in Japanese Published Patent Application No. Hei. 7-43565. In the optical module disclosed in this publication, a substrate having a V groove on its upper surface is employed, and an optical fiber is disposed in the V groove. A laser diode is disposed on the upper surface of the substrate outside the V groove so that a light emitting part of the laser diode faces a core of the optical fiber. In this optical module, since the laser diode is fixed directly onto the upper surface of the substrate, when the laser diode is fabricated so that the distance from the lower surface of the laser diode to the light emitting point is equal to the distance from the upper surface of the substrate to the core of the optical fiber, alignment of the laser diode with the optical fiber is accurately performed in the direction perpendicular to the surface of the substrate (hereinafter referred to as height direction).

Meanwhile, in an optical module employing a photodiode, when the photodiode is a facet incidence type having a light responsive part on its facet, this photodiode is fixed directly onto the upper surface of the substrate as in the above-mentioned optical module including the laser diode, whereby alignment between the photodiode and the optical fiber in the height direction is accurately performed. However, when a surface incidence type photodiode having a light responsive part on its surface is employed, since the photodiode must be disposed so that the light responsive part is perpendicular to the optical axis of the optical fiber or a little off the direction, a block for fixing the photodiode is usually used.

FIGS. 15 and 16($a$)–16($c$) are diagrams illustrating a conventional optical module in which a surface incidence type photodiode and an optical fiber are optically coupled with each other.

The optical module includes a photodiode 1, a block 2 on which the photodiode 1 is fixed, an optical fiber 3, a substrate 4 having a V groove 41 in which the optical fiber is fixed (hereinafter referred to as a V-groove substrate), a cover 5 having a V groove 51 (hereinafter referred to as a V-groove cover), a package 6, and a cover 7 of the package 6. In the optical module, the block 2 on which the photodiode 1 is fixed and the V-groove substrate 4 on which the optical fiber 3 is fixed are arranged in the package 6 so that an end facet of the optical fiber 3 is opposed to a light responsive surface of the photodiode 1.

As shown in FIG. 16($c$), the photodiode 1 has a light responsive part 11 in the center of the upper surface, and the light responsive part 11 receives a light beam emitted from the optical fiber 3. The photodiode 1 is fixed onto a side surface of the block 2 and connected to an electrode 2$a$ on the block 2 with a feeding wire 2$c$. The electrode 2$a$ on the block 2 is connected to an electrode of the package 6 with feeding wires 2$b$.

As shown in FIGS. 16($a$) and 16($b$), the optical fiber 3 comprises a core 31 and a cladding 32 surrounding the core 31. Since the refractive index of the core 31 is higher than the refractive index of the cladding 32, light incident on the optical fiber 3 is guided through the core 31. The optical fiber 3 is sandwiched between the V-groove substrate 4 and the V-groove cover 5 and fitted in the V groove 41 of the substrate 4 and the V groove 51 of the cover 5. Since the V groove 41 of the substrate 4 is formed by photolithography, the width and the depth of the V groove 41 are controlled with an accuracy better than 1 $\mu$m. Hence, when the optical fiber 3 is fitted in the V groove 41, the distance between the core 31 in the center of the optical fiber 3 and the upper surface of the V-groove substrate 4 is determined with high accuracy.

A description is given of the method for fabricating the optical module. FIG. 20 is a flow chart illustrating process steps in the method of fabricating the optical module.

Initially, in step S1, positioning of the photodiode 1 in the height direction (y direction) is performed by pictorial pattern recognition so that the distance $t_2$ from the light responsive part 11 of the photodiode 1 to the rear surface 2$d$ of the block 2 is equal to the sum of the thickness $t_1$ of the V-groove substrate 4 and the distance from the core 31 of the optical fiber 3 to the surface of the substrate 4, followed by fixing the photodiode 1 onto the side surface of the block 2 with Au or Sn solder, or a resin. In step S2, the photodiode 1 is connected to the electrode 2$a$ on the block 2 with the feeding wire 2$c$. Thereafter, in step S3, the V-groove substrate 4 is fixed onto the package 6 with a resin or the like. Next, in step S4, positioning of the block 2 in the horizontal direction (x direction) is performed by pictorial pattern recognition so that the light responsive part 11 of the photodiode 1 on the block 2 is opposed to the center of the V groove 41 of the substrate 4, followed by fixing the block 2 onto the package 6 with a resin or the like. In step S5, the optical fiber 3 is fitted in the V groove 41 of the substrate 4. In step S6, the V-groove cover 5 is fixed on the V-groove substrate 4 so that the optical fiber 3 is fitted in the V groove 51 of the cover 5. In step S7, the electrode 2$a$ on the block 2 is connected to the electrodes of the package 6 with the feeding wires 2$b$. Finally, in step S8, the package 6 is sealed with the package cover 7, completing the optical module shown in FIGS. 15 and 16($a$)–16($c$).

FIGS. 17 and 18 are a perspective view and a cross-sectional view illustrating an optical module in which a surface incidence type photodiode and an optical fiber are optically coupled with each other, according to a prior art.

This optical module is similar to an optical module disclosed in "PD Module with Pre-Amplifier on an Si Platform", Extended Abstracts, 1996 General Meeting of Institute of Electronic Information Communication, (p219:C-219). In this optical module, a block for fixing a photodiode as the block 2 used in the optical module shown in FIG. 15 is not used, and a photodiode 1 is disposed directly on a V-groove substrate 8, whereby the photodiode 1 is optically coupled with an optical fiber 3. More specifically, as shown in FIGS. 17 and 18, a substrate 8 has a V groove 8$a$ and a hole 9 connected to the V groove 8$a$. The optical fiber 3 is fitted in the V groove 8$a$ with an end portion protruding into the hole 9, and the photodiode 1 is disposed on an inclined side wall 9$a$ in the groove 9, facing the optical fiber 3. Since the photodiode 1 is disposed on the inclined surface 9$a$, a light responsive surface 11 of the photodiode 1 is inclined in the height direction, i.e., it is not perpendicular to the optical axis of the optical fiber 3.

A description is given of the method for fabricating the optical module. FIG. 21 is a flow chart illustrating process steps in the method of fabricating the optical module.

Initially, in step S1, positioning of the photodiode 1 in the height direction is performed by pictorial pattern recognition so that the distance from the surface of the substrate 8 to the light responsive part 11 of the photodiode 1 is equal to the distance from the surface of the substrate 8 to the core of the optical fiber 3, and positioning of the photodiode 1 in the horizontal direction is performed by pictorial pattern recognition so that the light responsive part 11 of the photodiode 1 is opposed to the center of the V groove 8a, followed by fixing the photodiode 1 on the inclined surface 9a using a resin or the like. Then, in step S2, the photodiode 1 is connected to an electrode 2a on the V-groove substrate 8 with a feeding wire 2c. In step S3, the V-groove substrate 8 is die-bonded to a package (not shown) with a resin or the like. In step S4, the electrode 2a on the V-groove substrate 8 is connected to electrodes on the package with feeding wires 2b. Thereafter, in step S5, the optical fiber 3 is fitted in the V groove 8a of the substrate 8. Finally, in step S6, a V-groove cover (not shown) is fixed on the V-groove substrate 8, and the package is sealed with a package cover (not shown), completing the optical module.

Meanwhile, Japanese Published Patent Application No. Hei. 2-149805 discloses a method for coupling an optical fiber with an optical waveguide on a substrate, in which a waveguide substrate on which an optical waveguide is fabricated is connected to a connecting member on which an optical fiber is disposed, and the waveguide substrate and the connecting member are disposed on an upper surface of the substrate, with the surfaces of the waveguide substrate and the connecting member contacting the upper surface of the substrate, whereby the optical fiber is coupled with the optical waveguide. However, this coupling method is different from the coupling method of the optical module in which a photodiode fixed onto a block is optically coupled with an optical fiber, so that it is hard to say that this prior art method relates to the present invention.

A description is now given of optical fiber deviation vs. coupling efficiency characteristics between an optical fiber and a photodiode.

FIG. 19 is a graph illustrating optical axis deviations between an optical fiber and a photodiode which are separated by a distance of 50 $\mu$m, which deviations are allowable for optical coupling between the optical fiber and the photodiode.

In FIG. 19, the ordinate shows the coupling efficiency (%), and the abscissa shows the optical axis deviation ($\mu$m). A solid line, a dotted line, and an alternate long and short dash line show calculated values when the diameter of the light responsive part of the photodiode is 20 $\mu$m, 30 $\mu$m, and 40 $\mu$m, respectively. Black dots, black triangles, and black squares show measured values when the diameter of the light responsive part is 20 $\mu$m, 30 $\mu$m, and 40 $\mu$m, respectively.

As shown in FIG. 19, when the diameter of the light responsive part of the photodiode is 20 $\mu$m, in order to secure a coupling efficiency of 90% between the optical fiber and the photodiode separated by a distance of 50 $\mu$m, the allowable optical axis deviation is about 5 $\mu$m.

In the prior art optical module shown in FIG. 15, even though the distance between the upper surface of the V-groove substrate 4 and the center of the optical fiber 3 is accurately determined, the coupling efficiency between the core 31 of the optical fiber 3 and the light responsive part 11 of the photodiode 1 varies according to the following factors:

1) the thickness of the V-groove substrate 4 supporting the optical fiber 3

2) the accuracy of the position (height) of the photodiode 1 when the photodiode 1 is fixed onto the block 2

3) the positioning accuracy when the block 2 is fixed onto the package 6

The thickness of the V-groove substrate 4 has a variation of $\pm 10$ $\mu$m, and the accuracy in fixing the photodiode 1 on the block 2 has a variation of $\pm 5$ $\mu$m. Therefore, an optical axis deviation of about $\pm 15$ $\mu$m is produced between the optical fiber 3 and the photodiode 1 in the height direction (y direction). Further, since the accuracy in fixing the block 2 onto the package 6 has a variation of $\pm 5$ $\mu$m, an optical axis deviation of about $\pm 5$ $\mu$m is produced between the optical fiber 3 and the photodiode 1 in the horizontal direction (x direction).

Accordingly, in the optical module shown in FIG. 5, since the optical axis deviation between the photodiode 1 and the optical fiber 3 in the height direction (y direction) is about $\pm 15$ $\mu$m, when the optical fiber 3 and the photodiode 1 are separated by a distance of 50 $\mu$m and the diameter of the light responsive part of the photodiode 1 is 20 $\mu$m or 30 $\mu$m, it is difficult to achieve a coupling efficiency higher than 90%, as is evident from FIG. 19. That is, when the optical axis deviation is within $\pm 5$ $\mu$m, a coupling efficiency higher than 90% is realized. Relating to the accuracy of the position (height) of the photodiode when it is fixed onto the block 2 and the positioning accuracy when the block 2 is fixed onto the package, the variations of these accuracies can be suppressed within $\pm 5$ $\mu$m by highly accurate pictorial pattern recognition. However, relating to the thickness of the V-groove substrate 4 on which the optical fiber 3 is fixed, since a conventional Si substrate within a specified standard is usually employed, it is almost impossible to suppress the variation in the thickness of the substrate within $\pm 5$ $\mu$m. As a result, in the prior art optical module shown in FIG. 15, it is difficult to accurately align the photodiode 1 with the optical fiber 3 in the height direction.

On the other hand, in the prior art optical module shown in FIGS. 17 and 18, although the optical coupling between the photodiode 1 and the optical fiber 3 is realized without being influenced by the thickness of the V-groove substrate 8, since the surface 9a of the substrate on which the photodiode 1 is disposed is inclined, formation of the electrode 2a on the inclined surface 9a, mounting of the photodiode 1 on the inclined surface 9a, and bonding of the feeding wire 2c to connect the photodiode 1 with the substrate 8 are complicated.

SUMMARY OF THE INVENTION

It is an object of the present invention to provide an optical module that facilitates mounting of a photodiode and that secures a high alignment accuracy between the photodiode and an optical fiber.

It is another object of the present invention to provide a method for fabricating the optical module.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an optical module comprises a substrate having an upper surface and a groove on the upper surface; an optical fiber having a core and an end facet, disposed in the groove of the substrate; an optical semiconductor device having an upper surface, and a light responsive or light emitting part on the upper surface, which part is optically coupled with the optical fiber; and a block having a side surface on which the optical semiconductor device is fixed, and a lower surface perpendicular to the side surface. The optical semiconductor device is fixed onto the side surface of the block in such a position that the distance from the light responsive or light emitting part to the lower surface of the block is equal to the distance from the core of the optical fiber to the upper surface of the substrate; and the block is disposed on the substrate, with the lower surface contacting the upper surface of the substrate, so that the light responsive or light emitting part of the optical semiconductor device is opposed to the end facet of the optical fiber. Since the height of the upper surface of the substrate on which the optical fiber is fixed is equal to the height of the upper surface of the substrate on which the block is disposed, when the block is fixed to the upper surface of the substrate, alignment between the core of the optical fiber and the light responsive or light emitting part of the optical semiconductor device in the height direction is accurately performed with the surface of the substrate as a reference, without influenced by the thickness of the substrate, resulting in a high coupling efficiency between the optical fiber and the optical semiconductor device.

According to a second aspect of the present invention, in the above-mentioned optical module, the substrate has a second groove in the vicinity of the end facet of the optical fiber, which second groove is perpendicular to the longitudinal direction of the optical fiber; the block has a portion protruding from the lower surface and having a surface coplanar with the side surface; the optical semiconductor device is fixed onto the side surface of the block with the protruding portion; and the block is disposed on the upper surface of the substrate so that the protruding portion is disposed in the second groove of the substrate and an inside surface of the protruding portion, opposite the surface with the optical semiconductor device, contacts the substrate at a side surface in the second groove. Therefore, alignment between the core of the optical fiber and the light responsive or light emitting part of the optical semiconductor device in the height direction is accurately performed with the surface of the substrate as a reference, without influenced by the thickness of the substrate, resulting in a high coupling efficiency between the optical fiber and the optical semiconductor device.

According to a third aspect of the present invention, in the above-mentioned optical module, the substrate has a hole in the vicinity of the end facet of the optical fiber; the block is convex in shape and has a portion protruding from the lower surface; and the block is disposed on the upper surface of the substrate so that the protruding portion of the block is disposed in the hole of the substrate. Therefore, alignment between the core of the optical fiber and the light responsive or light emitting part of the optical semiconductor device in the height direction is accurately performed with the surface of the substrate as a reference, without influenced by the thickness of the substrate, resulting in a high coupling efficiency between the optical fiber and the optical semiconductor device.

According to a fourth aspect of the present invention, in the above-mentioned optical module, the substrate has a hole in the vicinity of the end facet of the optical fiber; the block is rectangular in shape, and the optical semiconductor device is fixed onto the side surface of the block so that a portion of the optical semiconductor device protrudes over the lower surface of the block; and the block is disposed on the upper surface of the substrate so that the protruding portion of the optical semiconductor device is disposed in the hole of the substrate. Therefore, alignment between the core of the optical fiber and the light responsive or light emitting part of the optical semiconductor device in the height direction is accurately performed with the surface of the substrate as a reference, without influenced by the thickness of the substrate. In addition, since the rectangular block is formed in a relatively simple process with high dimensional accuracy as compared with the above-mentioned blocks with the protruding parts, the coupling efficiency between the optical fiber and the optical semiconductor device is further improved.

According to a fifth aspect of the present invention, in the above-mentioned optical module, the substrate has a hole in the vicinity of the end facet of the optical fiber, and sloping side surfaces in the hole; the block has a portion protruding from the lower surface, and the protruding portion has side surfaces that slope at the same angle as the sloping side surfaces of the substrate in the hole; and the block is disposed on the upper surface of the substrate so that the protruding portion is disposed in the hole of the substrate. Therefore, alignment between the core of the optical fiber and the light responsive or light emitting part of the optical semiconductor device in the height direction is accurately performed with the surface of the substrate as a reference, without influenced by the thickness of the substrate, resulting in a high coupling efficiency between the optical fiber and the optical semiconductor device. In addition, since the protruding part of the convex block is fitted in the hole of the substrate, it is possible to accurately fix the block on the substrate without positioning of the block in the horizontal direction using pictorial pattern recognition or the like.

According to a sixth aspect of the present invention, an optical module comprises a substrate having an upper surface; an optical waveguide having a core and an end facet, disposed on the upper surface of the substrate; an optical semiconductor device having an upper surface, and a light responsive or light emitting part on the upper surface, which part is optically coupled with the optical waveguide; and a block having a side surface on which the optical semiconductor device is fixed, and a lower surface perpendicular to the side surface. The optical semiconductor device is fixed onto the side surface of the block in such a position that the distance from the light responsive or light emitting part to the lower surface of the block is equal to the distance from the core of the optical waveguide to the upper surface of the substrate; and the block is disposed on the substrate, with the lower surface contacting the upper surface of the substrate, so that the light responsive or light emitting part of the optical semiconductor device is opposed to the end facet of the optical waveguide. Therefore, alignment between the light responsive or light emitting part of the optical semiconductor device and the core of the optical waveguide in the height direction is accurately performed, with the upper surface of the substrate as a reference, without influenced by the thickness of the substrate, resulting in a high coupling efficiency between the optical waveguide and the optical semiconductor device. In addition, since the optical waveguide is employed, hybrid integration on the substrate is possible.

According to a seventh aspect of the present invention, a method of fabricating an optical module comprises preparing a substrate having, on its upper surface, a groove for fixing an optical fiber, an optical fiber having a core, an optical semiconductor device having a light responsive or light emitting part on its upper surface, and a block for fixing the optical semiconductor device; fixing the optical semiconductor device on a side surface of the block after positioning of the semiconductor device in the direction perpendicular to the surface of the substrate in such a position that the distance from the light responsive or light emitting part of the semiconductor device to the lower surface of the block is equal to the distance from the core of the optical fiber to the upper surface of the substrate when the optical fiber is disposed in the groove of the substrate; fixing the block on the upper surface of the substrate after positioning of the block in the horizontal direction in such a position that the light responsive or light emitting part of the semiconductor device is opposed to the center of the groove of the substrate; and fixing the optical fiber in the groove of the substrate. Therefore, when the block is fixed to the upper surface of the substrate, alignment between the core of the optical fiber and the light responsive or light emitting part of the optical semiconductor device in the height direction is accurately performed with the surface of the substrate as a reference, without influenced by the thickness of the substrate, resulting in a high coupling efficiency between the optical fiber and the optical semiconductor device.

According to an eighth aspect of the present invention, a method of fabricating an optical module comprises preparing a substrate having an upper surface, an optical waveguide having a core, an optical semiconductor device having a light responsive or light emitting part on its upper surface, and a block for fixing the optical semiconductor device; fixing the optical semiconductor device on a side surface of the block after positioning of the semiconductor device in the direction perpendicular to the surface of the substrate in such a position that the distance from the light responsive or light emitting part of the semiconductor device to the lower surface of the block is equal to the distance from the core of the optical waveguide to the upper surface of the substrate when the optical waveguide is disposed on the upper surface of the substrate; fixing the block on the upper surface of the substrate after positioning of the block in the horizontal direction in such a position that the light responsive or light emitting part of the semiconductor device is opposed to the center of the groove of the substrate; and fixing the optical waveguide on the upper surface of the substrate. Therefore, when the block is fixed to the upper surface of the substrate, alignment between the core of the optical waveguide and the light responsive or light emitting part of the optical semiconductor device in the height direction is accurately performed with the surface of the substrate as a reference, without influenced by the thickness of the substrate, resulting in a high coupling efficiency between the optical waveguide and the optical semiconductor device.

DETAILED DESCRIPTION OF THE PREFERRED EMBODIMENTS

[Embodiment 1]

Figure 1:
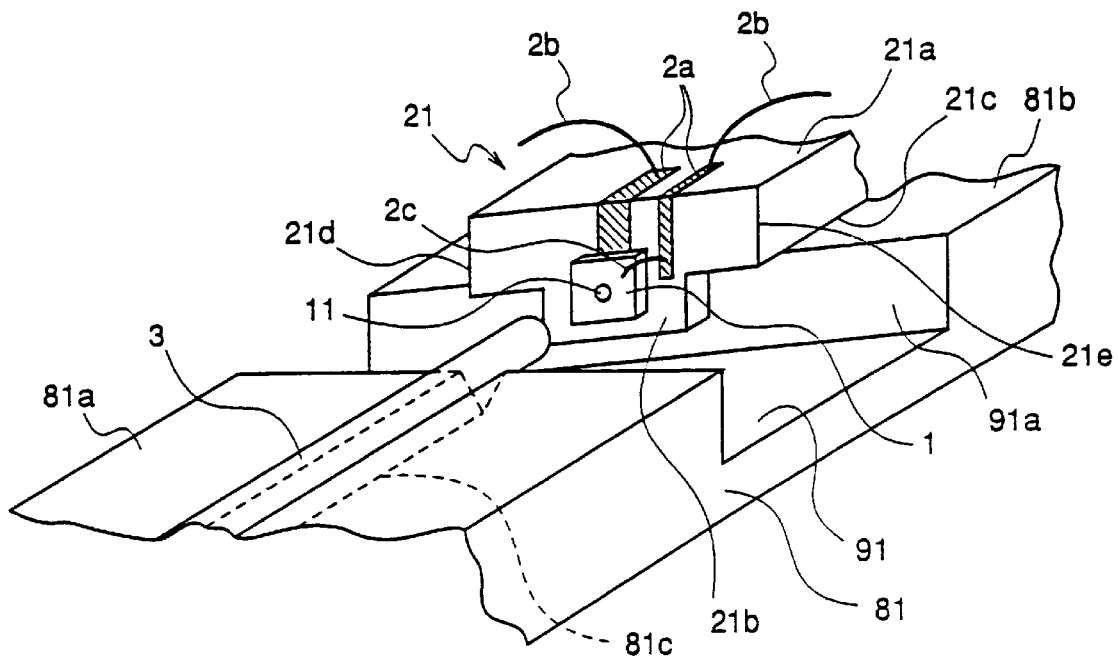
FIG. 1 is a perspective view illustrating an optical module according to a first embodiment of the present invention.
Figure 4:
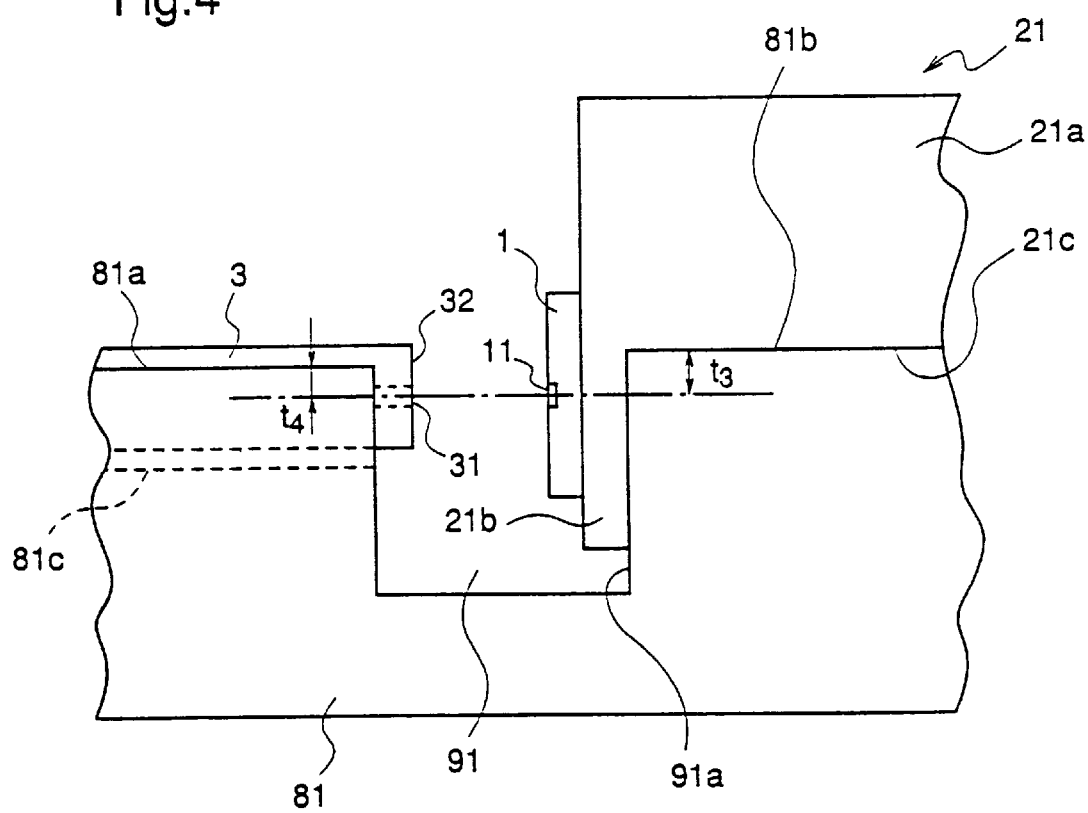
FIG. 4 is a side view illustrating the optical module according to the first embodiment.

FIG. 1 is a perspective view illustrating an optical module in accordance with a first embodiment of the present invention, and FIG. 4 is a side view of the optical module.

An optical module according to the first embodiment includes a substrate 81 having upper surfaces 81a and 81b, a V groove 81c on the upper surface 81a, and a groove 91 between the upper surfaces 81a and 81b. An optical fiber 3 is fitted in the V groove 81c of the substrate 81. A photodiode 1 having a light responsive part 11 to be optically coupled with the optical fiber 3 is disposed on a side surface of a block 21 so that the distance $t_3$ from the light responsive part 11 of the photodiode 1 to a lower surface 21c of the block 21 is equal to the distance $t_4$ from the core 31 of the optical fiber 3 to the upper surface 81a of the substrate 81. The block 21 is disposed on the upper surface 81b of the substrate 81, which is coplanar with the upper surface 81a on which the optical fiber 3 is disposed, with the lower surface 21c contacting the upper surface 81b of the substrate 81 and the light responsive part 11 of the photodiode 1 being opposed to an end facet of the optical fiber 3. The distance between the light responsive part 11 of the photodiode 1 and the end facet of the optical fiber 3 is 50 μm.

The optical module so constructed operates as follows. When light guided through the optical fiber 3 is emitted from the end facet of the optical fiber 3 and applied to the light responsive part 11 of the photodiode 11, the photodiode 1 generates a voltage in response to the intensity of the light applied to the light responsive part 11.

The structure of the optical module will be described in more detail.

The optical fiber 3 is fitted in the V groove 81c on the upper surface 81a of the substrate 81 so that an end portion thereof protrudes into the groove 91 of the substrate 81. The optical fiber 3 comprises a core 31 and a cladding 32 surrounding the core 31. Various kinds of fibers, for example, glass fibers and plastic fibers, are applicable. The outer diameter of the optical fiber 3 is about 125 μm, and the diameter of the core 31 is about 10 μm. The refractive index of the core 31 is higher than the refractive index of the clad 32, so that light incident on the optical fiber 3 is guided through the core 31.

The block 21 comprises a block body 21a and a protruding part 21b that sticks out from the lower surface 21c of the block body 21a. The photodiode 1 is fixed onto a side surface of the block 21 having the protruding part 21b. As shown in FIG. 4, the position of the photodiode 1 in the height direction is determined so that the distance $t_3$ from the light responsive part 11 to the lower surface 21c of the block 21 is equal to the distance $t_4$ from the core 31 of the optical fiber 3 to the upper surface 81a of the substrate 81. As shown in FIG. 1, the photodiode 1 is connected to electrodes 2a on the block 21 with a feeding wire 2c, and the electrodes 2a are connected to electrodes on a package (not shown) with feeding wires 2b. The photodiode 1 has the light responsive part 11 in the center of the upper surface. When light emitted from the optical fiber 3 is applied to the light responsive part 11, the photodiode 1 generates a voltage in response to the intensity of the light. The size of the photodiode 1 is about 300×300 μm, and the diameter of the light responsive part 11 is about 30 μm. The block 21 on which the photodiode 1 is fixed is disposed on the upper surface 81b of the substrate 81, with the protruding part 21b being disposed in the groove 91 of the substrate 81 so that the inner surface of the protruding part 21b, opposed to the surface with the photodiode 1, contacts the side surface 91a of the substrate 81 in the groove 91. The the block 21 is positioned in the horizontal direction so that the light responsive part 11 of the photodiode 1 is opposed to the core 31 of the optical fiber 3.

Figure 2:
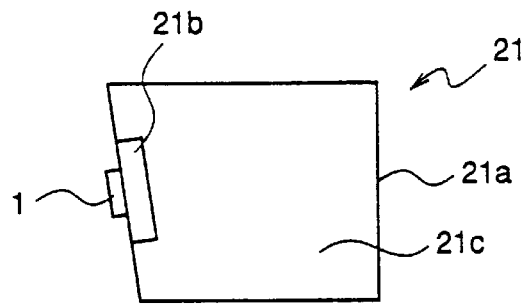
FIG. 2 is a bottom view of a block employed in the optical module shown in FIG. 1.

The block 21 with the photodiode 1 will be described in more detail. FIG. 2 is a bottom plan view of the block 21 with the photodiode 11. As mentioned above, the block 21 comprises an almost rectangular block body 21a and a protruding part 21b that sticks out from the lower surface 21c of the block body 21a. The block 21 is produced by mechanically cutting a ceramic or the like. The photodiode 1 is fixed to a side surface of the block 21 having the protruding part 21b, and this side surface with the photodiode 1 is slightly inclined to one side, i.e., it is not parallel with the opposed side surface. The purpose of the inclined side surface of the block 21 on which the photodiode 1 is fixed is to place the photodiode 1 in the optical module with the light responsive surface being inclined to one side, i.e., being not perpendicular to the optical axis of the optical fiber 3, whereby light reflected by the light responsive surface of the photodiode 1 is not applied to the optical fiber 3.

Figure 3:
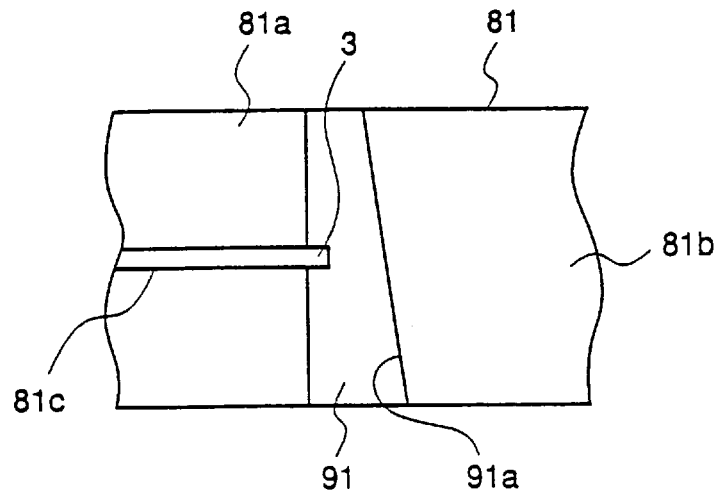
FIG. 3 is a plan view of a substrate employed in the module shown in FIG. 1.

The substrate 81 will be described in more detail. FIG. 3 is a top plan view of the substrate 81. The substrate 81 has a thickness of about 500 μm and comprises a semiconductor material, such as Si or GaAs. As shown in FIG. 3, the substrate 81 has an upper surface 81a with a V groove 81c in which the optical fiber 3 is fitted, a groove 91 perpendicular to the V groove 81c, and a surface 81b facing the surface 81a across the groove 91. An end portion of the optical fiber 3 protrudes into the groove 91. Since the V groove 81c is produced by photolithography, the width and the depth of the V groove 81c can be controlled with an accuracy better than 1 μm. For example, when an Si substrate having a (100) surface is employed as the substrate 81 and a portion of the (100) surface where a V groove is desired is etched while masking the other portion, since (111) planes are produced by the etching, a V groove having an angle of 70.52° is produced with accurately. Therefore, when the optical fiber 3 is fitted in the V groove 81c, the distance between the core 31a of the optical fiber 3 and the upper surface 81a of the substrate 81 is decided with high accuracy. Further, the side surface 91a of the substrate 81 in the groove 91, on which the block 21 is disposed later, is inclined to one side, i.e., it is not parallel with the opposed side surface. The inclination of the side surface 91a corresponds to the inclination of the side surface of the block 21 having the protruding part 21b. That is, the groove 91 is formed so that the inner surface of the protruding part 21b of the block 21, opposite the surface with the photodiode 1, closely contacts the side surface 91a when the block 21 is disposed on the upper surface 81b of the substrate 81.

Although the side surface of the block body 21a with the protruding part 21b is inclined, the block body 21a may be rectangular in shape.

A description is given of a method for fabricating the optical module according to the first embodiment of the invention.

Initially, as shown in FIG. 4, positioning of the photodiode 1 in the height direction is performed by pictorial pattern recognition or other methods so that the distance $t_3$ from the center of the light responsive part 11 of the photodiode 1 to the lower surface 21c of the block 21 is equal to the distance $t_4$ from the center of the core 31 of the optical fiber 3 to the upper surface 81a of the substrate 81, which distance $t_4$ is decided when the optical fiber 3 is fitted in the V groove 81a of the substrate 81. Further, positioning of the photodiode 1 in the horizontal direction, i.e., between the opposed edges 21d and 21e of the block 21, is performed so that the center of the light responsive part 11 of the photodiode 1 is opposed to the center of the V groove 81c for fixing the optical fiber 3 when the block 21 is disposed in a prescribed position on the upper surface 81b of the substrate 81. After the positioning, the photodiode 1 is bonded to the side surface of the block 21 having the protruding part 21b using Au or Sn solder, or a resin. Thereafter, the photodiode 1 is connected to the electrode 2a on the block 21 with the feeding wire 2c.

Next, positioning of the block 21 in the horizontal direction is performed by pictorial pattern recognition or other methods so that the light responsive part 11 of the photodiode 1 is opposed to the center of the V groove 81c, followed by fixing the block 21 on the upper surface 81b of the substrate 81. When the block 21 is fixed to the substrate 81, the protruding part 21b of the block 21 is put in the groove 91 of the substrate 81, and the inner surface of the protruding part 21b, opposite the surface with the photodiode 1, is applied to the side surface 91a of the substrate 81 in the groove 91.

Next, the optical fiber 3 is fixed to the V groove 81c on the upper surface 81a of the substrate 81 with a resin or the like. The optical fiber 3 is fixed so that an end portion thereof protrudes into the groove 91 of the substrate 81. The distance $t_4$ from the upper surface 81a of the substrate 81 to the center of the core 31 of the optical fiber 3 is determined with high accuracy by fitting the optical fiber 3 in the V groove 81c because the V groove 81c is produced by photolithography with an accuracy better than 1 μm.

Thereafter, the substrate 81 is fixed onto a package (not shown), and the electrodes 2a on the block 21 are connected to electrodes on the package with feeding wires 2b. Finally, the package is sealed with a package cover (not shown) to complete the optical module according to the first embodiment of the invention.

In the fabrication process, the optical fiber 3 is fixed in the V groove 81c after the block 21 with the photodiode 1 is fixed to the substrate 81. However, the optical fiber 3 may be fixed to the V groove 81c before the block 21 is fixed to the substrate 81.

As described above, in the optical module according to the first embodiment of the invention, since the depth of the V groove 81c for fixing the optical fiber 3 is accurately determined by adjusting the mask width (V groove width) in the etching process to produce the V groove 81, the distance $t_4$ from the center of the core 31 of the optical fiber 3 to the upper surface 81a of the substrate 81 is determined accurately. Further, the photodiode 1 is accurately positioned by pictorial pattern recognition or other methods so that the distance $t_3$ from the center of the light responsive part 11 to the lower surface 21c of the block 21 contacting the upper surface 81b of the substrate 81 is equal to the distance $t_4$ from the center of the core 31 of the optical fiber 3 to the upper surface 81a of the substrate 81. Since the height of the upper surface 81a of the substrate 81 on which the optical fiber 3 is disposed is equal to the height of the upper surface 81b of the substrate on which the block 21 is disposed, when the block 21 is fixed onto the upper surface 81b, alignment of the core 31 of the optical fiber 3 with the light responsive part 11 of the photodiode 1 in the height direction is achieved with the upper surface of the substrate as a reference, with high accuracy, without influenced by the thickness of the substrate 81. As a result, the coupling efficiency between the optical fiber 3 and the photodiode 1 is improved.

[Embodiment 2]

Figure 5:
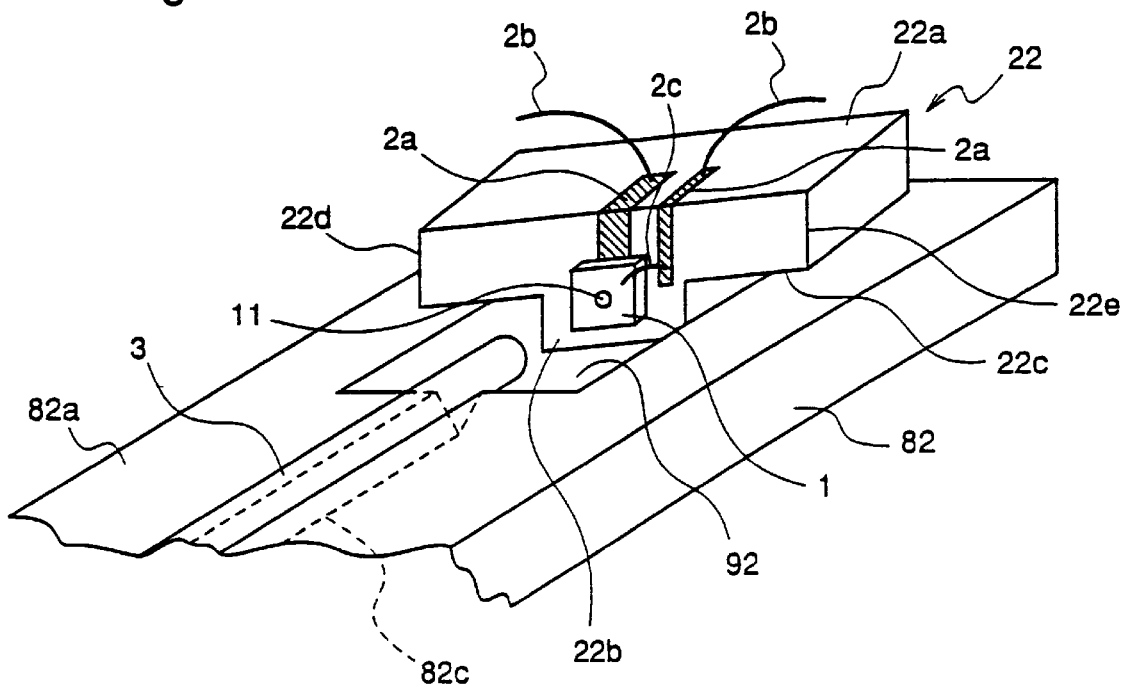
FIG. 5 is a perspective view illustrating an optical module according to a second embodiment of the invention.
Figure 6:
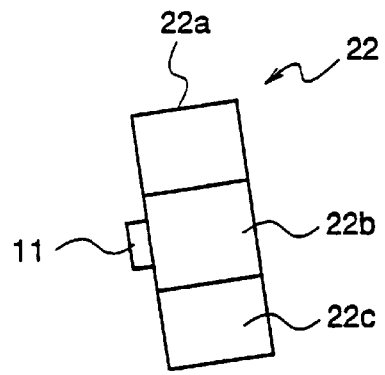
FIG. 6 is a bottom view of a block employed in the optical module shown in FIG. 5.
Figure 7:
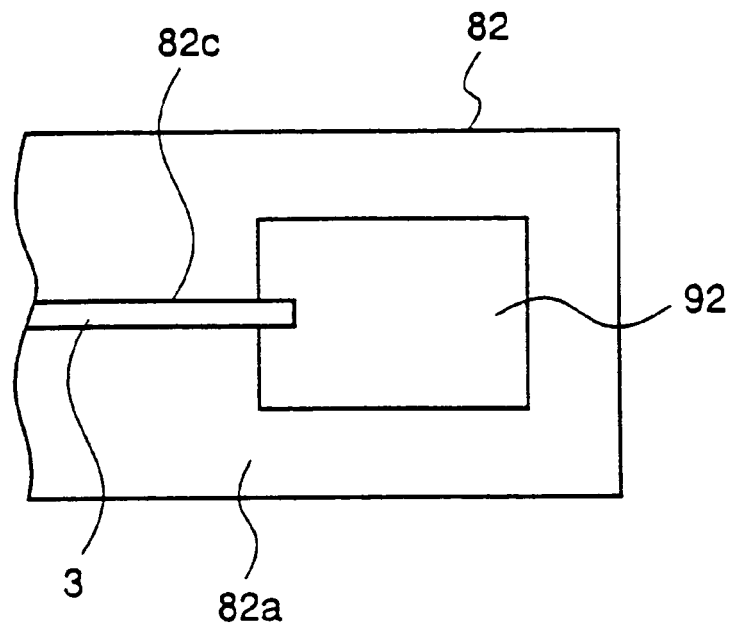
FIG. 7 is a plan view of a substrate employed in the optical module shown in FIG. 5.

FIG. 5 is a perspective view illustrating an optical module according to a second embodiment of the present invention. FIG. 6 is a bottom plan view of a convex block 22 included in the optical module shown in FIG. 5. FIG. 7 is a top plan view of a substrate 82 on which an optical fiber and a photodiode are mounted.

In this second embodiment of the invention, as shown in FIG. 5, a block 22 comprising a rectangular block body 22a and a rectangular protruding part 22b is employed as a block on which a photodiode 1 is mounted, and a substrate 82 having an opening 92 in which the protruding part 22b of the convex block 22 can be put is employed. The block 22 is disposed on an upper surface 82a of the substrate 82 so that its side surface with the photodiode 1 is about 8° off from a direction perpendicular to the optical axis of the optical fiber 3. The purpose of this 8° off setting of the block 22 is to prevent light reflected by the light responsive surface of the photodiode 1 from returning to the optical fiber 3, as already described for the optical module according to the first embodiment.

As shown in FIG. 6, the block 22 comprises a rectangular block body 22a and a rectangular protruding part 22b on its lower surface 22c. The block 22 is produced by mechanically cutting a ceramic or the like. The photodiode 1 is fixed to a side surface of the block 22.

As shown in FIG. 5, the substrate 82 has a V groove 82c at the upper surface 82a, in which the optical fiber 3 is disposed, and an opening connected with the V groove 82c, which hole can receive the protruding part 22b of the block 22. The optical fiber 3 is disposed in the V groove 82c so that an end portion thereof protrudes into the opening 92. Since the V groove 82c is produced by photolithography in the same manner as mentioned for the V groove 81c according to the first embodiment, the width and depth of the V groove 82c are controlled with an accuracy better than 1 μm.

A description is given of the method for fabricating the optical module.

Initially, the photodiode 1 is mounted on a side surface of the block 22. More specifically, first of all, positioning of the photodiode 1 on the block 22 in the height direction is performed by pictorial pattern recognition so that the distance from the center of the light responsive part 11 of the photodiode 1 to the lower surface 22c of the block 22 is equal to the distance from the center of the core 31 of the optical fiber 3 to the upper surface 82a of the substrate 82 when the optical fiber 3 is disposed in the V groove 82c at the upper surface 82a of the substrate 82. Thereafter, positioning of the photodiode 1 in the horizontal direction, i.e., between the edges 22d and 22d of the block 22, is performed so that the light responsive part 11 of the photodiode 1 is opposed to the center of the V groove 82c when the block 22 is disposed in a prescribed position on the surface 82a of the substrate 82, followed by bonding of the photodiode 1 on the side surface of the block 22 with Au or An solder or a resin. Then, the photodiode 1 and the electrode 2a of the block 22 are connected with each other using the feeding wire 2c.

Next, the block 22 is fixed to the upper surface 82a of the substrate 82. Hereinafter, the method of positioning and mounting the block 22 will be described in detail.

Figure 8:
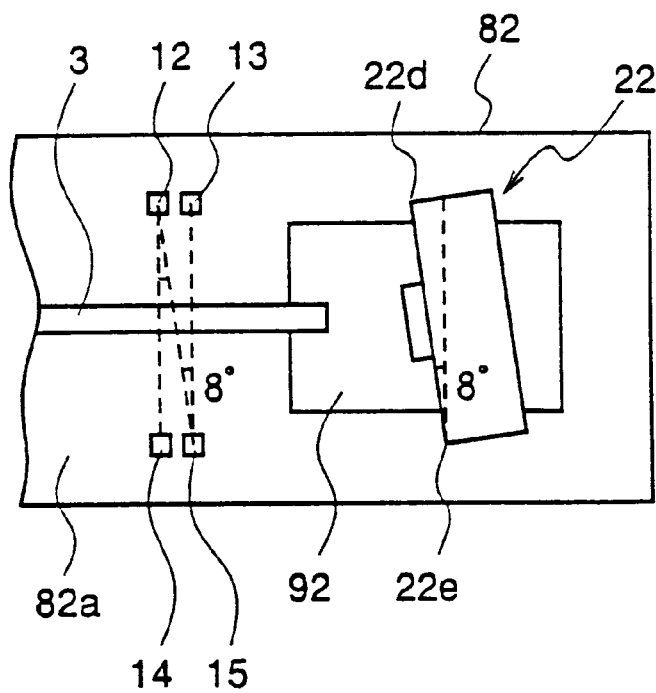
FIG. 8 is a schematic diagram for explaining positioning and mounting of the block in the horizontal direction in the optical module according to the second embodiment of the invention.

FIG. 8 is a plan view for explaining the method of positioning the block 22 in the horizontal direction and the method of mounting the block 22 on the substrate 82.

As shown in FIG. 8, positioning of the block 22 in the horizontal direction is performed by pictorial pattern recognition using four markers 12, 13, 14, and 15 which are formed on the upper surface 82a of the substrate 82 with high accuracy relative to the position of the V groove 82c of the substrate 82. More specifically, since an angle produced by the three markers 12, 15, and 13 is set to 8°, positioning of the block 22 in the horizontal direction is performed by pictorial pattern recognition of the markers 12, 13, 14, and 15 and the edges 22d and 22e of the block 22 and calculation of the position and the inclination of the block 22. Thereafter, the block 22 is fixed onto the upper surface 82a of the substrate 82 so that the protruding part 22b of the block 22 is disposed within the hole 92 of the substrate 81.

Next, the optical fiber 3 is fixed to the V groove 82c on the upper surface 82a of the substrate 82 with a resin or the like so that an end portion thereof protrudes into the opening 92 in the substrate 82. The distance from the upper surface 82a of the substrate 82 to the center of the core 31 of the optical fiber 3 is decided with high accuracy by fitting the optical fiber 3 in the V groove 82 because the V groove 82c is produced by photolithography that provides an accuracy better than 1 μm.

Finally, the electrode 2a on the block 22 and the electrodes on the package are connected with each other using the feeding wires 2b, and the package is sealed with the package cover, completing the optical module according to the second embodiment of the invention.

In the fabricating method, the optical fiber 3 is fitted in the V groove 82c after the block 22 with the photodiode 1 is fixed onto the substrate 81. However, the optical fiber 3 may be fitted in the V groove 81c before the block 21 is fixed onto the substrate 81.

As described above, since the optical module according to the second embodiment employs the block 22 and the substrate 82 having the opening 92 in the vicinity of the tip of the optical fiber 3, it is possible to perform accurate alignment of the center of the light responsive part 11 of the photodiode 1 and the center of the core 31 of the optical fiber 3 in the height direction, with the upper surface 82a of the substrate 82 as a reference, without being influenced by the thickness of the substrate 82. In addition, the convex block 22 with the rectangular protruding part 22b is produced in a relatively simple process with high dimensional accuracy as compared with the block 21 according to the first embodiment. As a result, an optical module with excellent coupling efficiency is realized.

[Embodiment 3]

Figure 9:
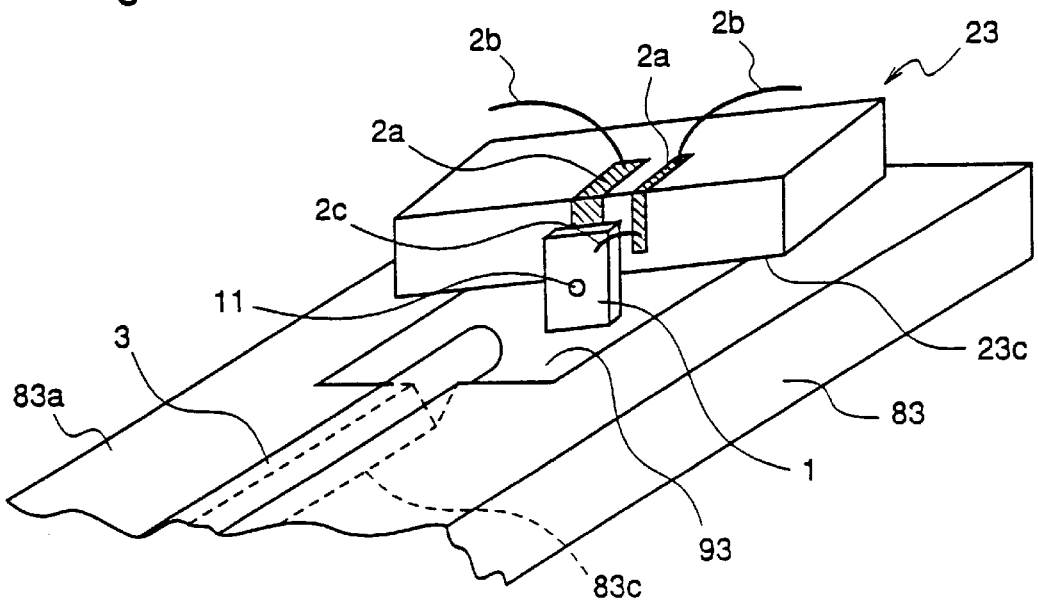
FIG. 9 is a perspective view illustrating an optical module according to a third embodiment of the invention.

FIG. 9 is a perspective view illustrating an optical module according to a third embodiment of the invention. In this optical module, a rectangular block 23 is employed as a block to which a photodiode 1 is fixed, and this block 23 is disposed on an upper surface 83a of a substrate 83 so that its surface with the photodiode 1 is about 8° off from a direction perpendicular to the optical axis of the optical fiber 3. The purpose of this 8° off setting of the block 23 is to prevent light reflected by the light responsive surface of the photodiode 1 from returning to the optical fiber 3, as already described for the optical module for the first embodiment.

Since the rectangular block 23 is produced in a relatively simple process with high accuracy, the accuracy in fixing the block 23 on the substrate 83 is improved. Further, since the photodiode 1 is fixed to the side surface of the block 23 so that a portion of the photodiode 1 protrudes over the lower surface 23c of the block, the block 23 may have a marginal portion on the side surface to steadily fix the photodiode 1 to the side surface.

As described above, since the optical module according to the third embodiment employs the rectangular block 23, accurate alignment between the center of the light responsive part 11 of the photodiode 1 and the center of the core 31 of the optical fiber 3 in the height direction is possible with the upper surface 83a of the substrate 83 as a reference, without being influenced by the thickness of the substrate 83. In addition, the rectangular block 23 can be formed in the relatively simple process with high dimensional accuracy as compared with the block 21 according to the first embodiment and the block 22 according to the second embodiment. As a result, an optical module with excellent coupling efficiency is realized.

[Embodiment 4]

Figure 10:
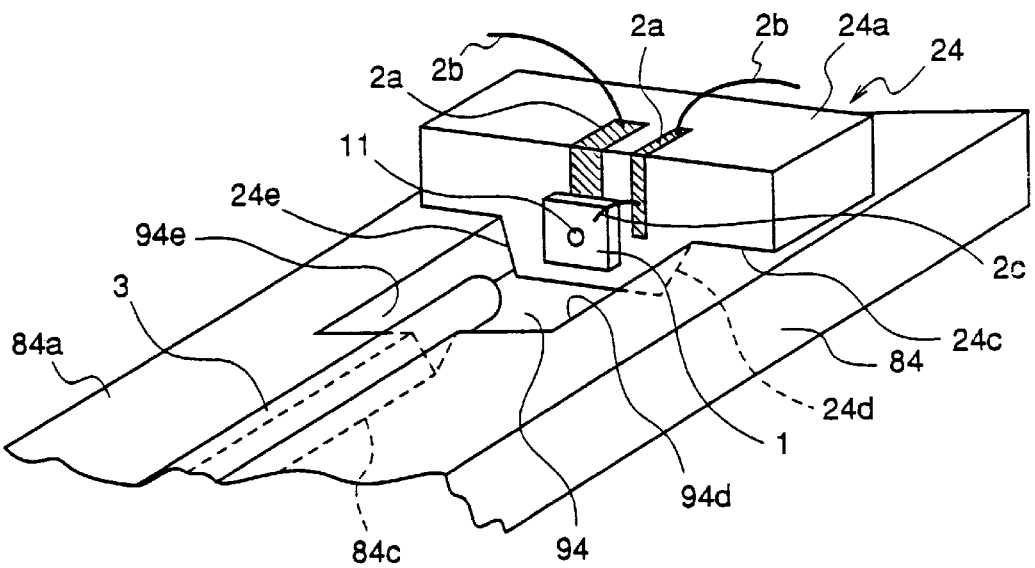
FIG. 10 is a perspective view illustrating an optical module according to a fourth embodiment of the invention.
Figure 11:
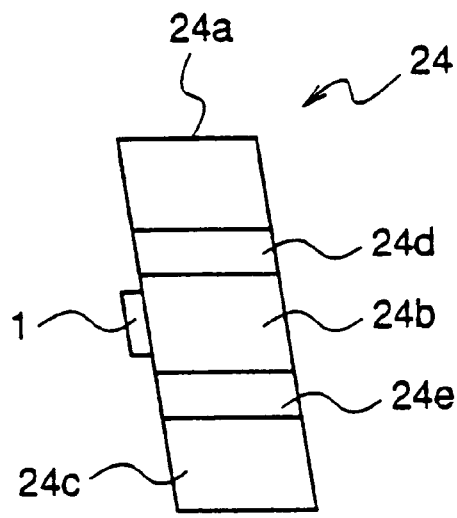
FIG. 11 is a bottom view of a block employed in the optical module shown in FIG. 10.
Figure 12:
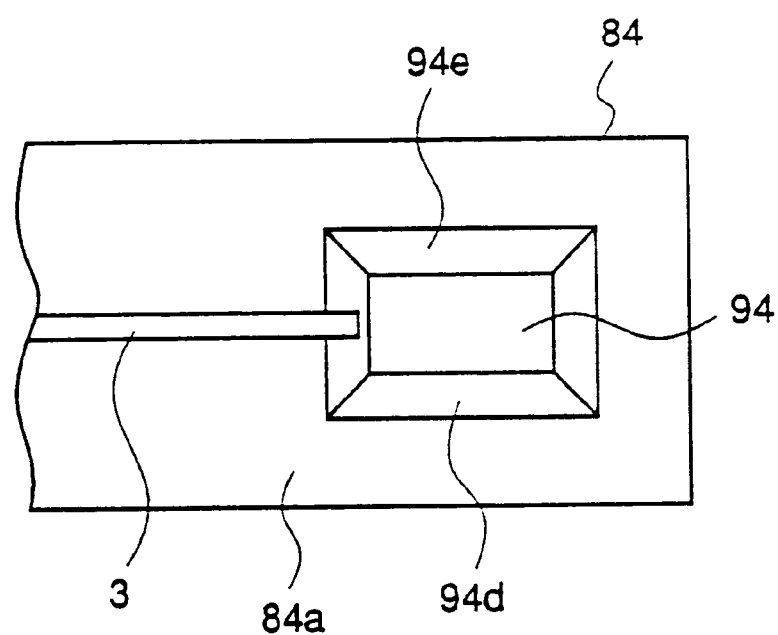
FIG. 12 is a plan view of a substrate employed in the optical module shown in FIG. 10.

FIG. 10 is a perspective view illustrating an optical module according to a fourth embodiment of the invention, FIG. 11 is a bottom view of a block employed in the optical module, and FIG. 12 is a top plan view of a substrate employed in the optical module.

In the optical module according to this fourth embodiment, a block 24 having a protruding part 24b is employed as a block to which a photodiode 1 is fixed, and a substrate 84 having an opening 94 in which the protruding part 24b of the block 24 can be fitted is employed. The block 24 is disposed on an upper surface 84a of the substrate 84 so that its surface with the photodiode 1 is about 8° off from a direction perpendicular to the optical axis of the optical fiber 3. The purpose of this 8° off setting of the block 24 is to prevent light reflected by the light responsive surface of the photodiode 1 from returning to the optical fiber 3.

The block 24 comprises, for example, Si, and has a rectangular block body 24a and a trapezoidal part 24b protruding from the lower surface 24c of the block body 24a, as shown in FIG. 11. The width of the protruding part 24b and the angles of the sloping surfaces 24e and 24d are accurately controlled by etching. The photodiode 1 is fixed onto the side surface of the block 24 so that the center of the light responsive part 11 on the protruding part 24b is opposed to the center of the V groove 84c of the substrate 84.

As shown in FIG. 12, the substrate 82 has an opening 94 in which the protruding part 24b of the block 24 can be fitted, and the opening 94 is connected to the V groove 84c in which the optical fiber 3 is fitted. That is, the opening 94 has sloping walls 94d and 94e that correspond to the sloping surfaces 24d and 24e of the protruding part 24c of the block 24.

As described above, since the optical module according to the fourth embodiment employs the block 24 and the substrate 84 having the hole 94 in the vicinity of the tip of the optical fiber 3, accurate alignment between the center of the light responsive part 11 of the photodiode 1 and the center of the core 31 of the optical fiber 3 in the height direction is performed with the upper surface 84a of the substrate 84 as a reference, without influenced by the thickness of the substrate 84. In addition, since the protruding part 24b of the being block 24 can be fitted in the hole of the substrate 84, it is possible to accurately fix the block 24 on the substrate 84, without positioning of the block 24 in the horizontal direction using pictorial pattern recognition or the like.

[Embodiment 5]

Figure 13:
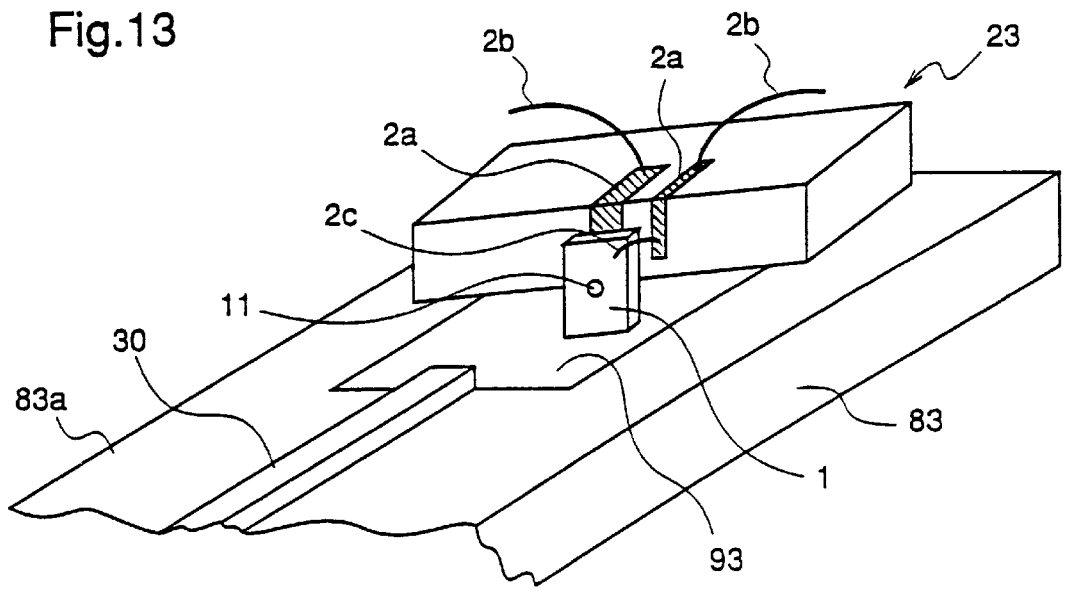
FIG. 13 is a perspective view illustrating an optical module according to a fifth embodiment of the present invention.

FIG. 13 is a perspective view illustrating an optical module according to a fifth embodiment of the present invention. In contrast with the optical modules according to the first to fourth embodiments, in the optical module according to this fifth embodiment, an optical waveguide is coupled with a photodiode, and the optical waveguide is disposed directly on an upper surface of a substrate.

More specifically, as shown in FIG. 13, the optical module comprises a substrate 83 having an upper surface 83a and an opening 93, an optical waveguide 30 disposed on the upper surface 83a of the substrate 83, a photodiode 1 having a light responsive part 11 to be optically coupled with the optical waveguide 30, and a block 23 on which the photodiode 1 is fixed. The photodiode 1 is fixed onto a side surface of the block 23 so that the distance from the light responsive part 11 of the photodiode 1 to the lower surface of the block 23 is equal to the distance from the core of the optical waveguide to the upper surface 83a of the substrate 83. The block 23 is disposed on the upper surface 83a of the substrate 83, with its bottom surface contacting the upper surface 83a, so that the light responsive surface of the photodiode 1 is opposed to an end facet of the optical waveguide 30. In addition, the distance from the light responsive part 11 of the photodiode 1 to the facet of the optical waveguide 30 is 50 μm.

As described above, since the optical module according to the fifth embodiment employs the rectangular block 23, accurate alignment between the center of the light responsive part 11 of the photodiode 1 and the center of the core 31 of the optical waveguide 30 in the height direction is performed with the upper surface 83a of the substrate 83 as a reference, without being influenced by the thickness of the substrate 83. In addition, since the optical waveguide 30 is employed, hybrid integration on the substrate 83 is possible.

[Embodiment 6]

Figure 14:
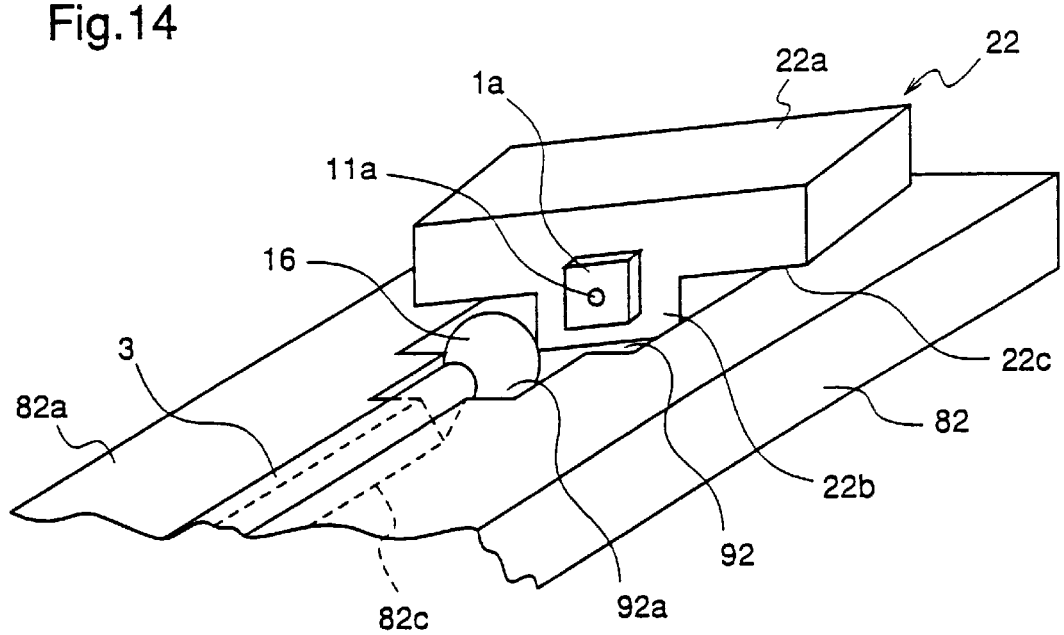
FIG. 14 is a perspective view illustrating an optical module according to a sixth embodiment of the present invention.
Figure 15:
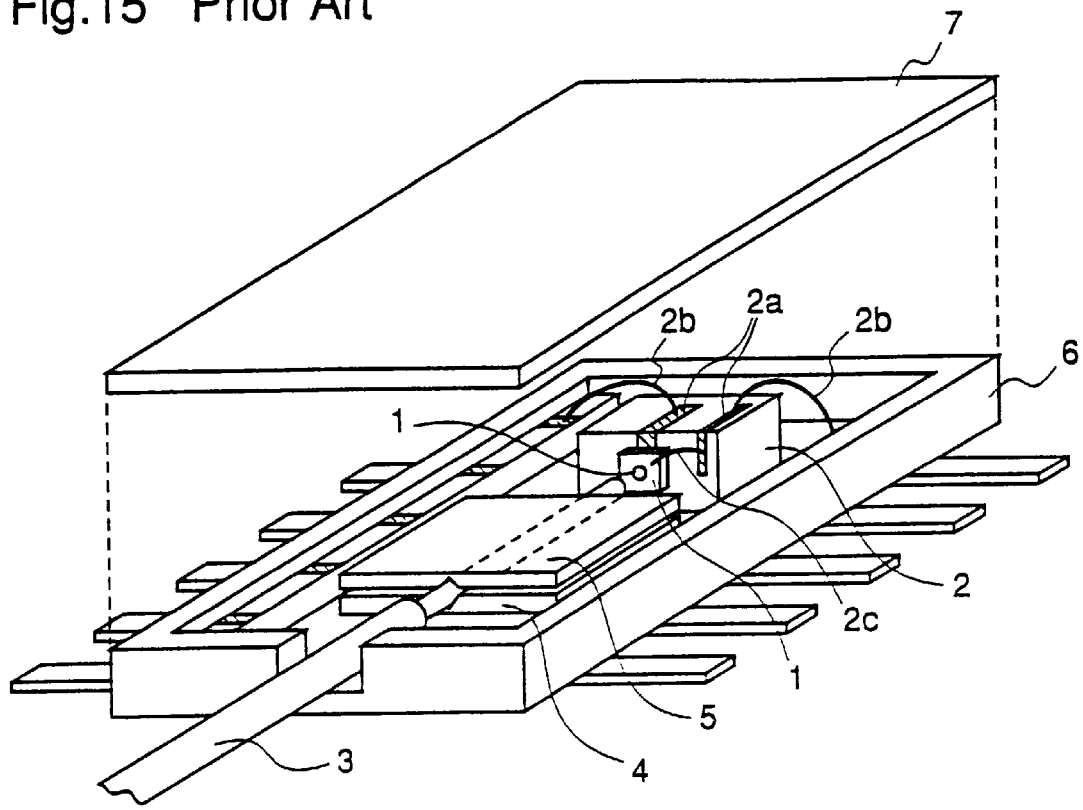
FIG. 15 is a perspective view illustrating an optical module according to the first prior art.
Figure 16:
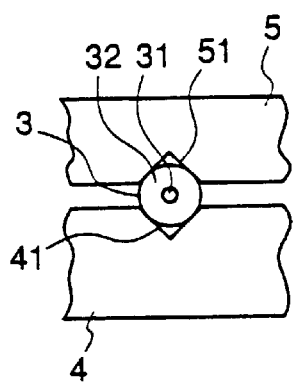
FIGS. 16(a)–16(c) are side views of the optical module shown in FIG. 15.
Figure 16:
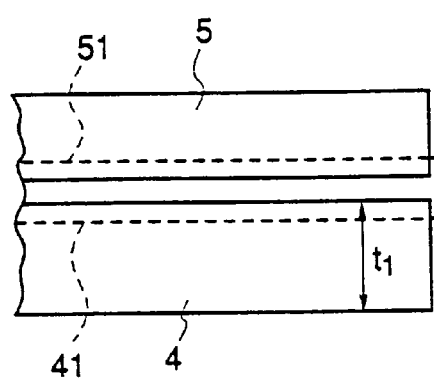
Figure 16:
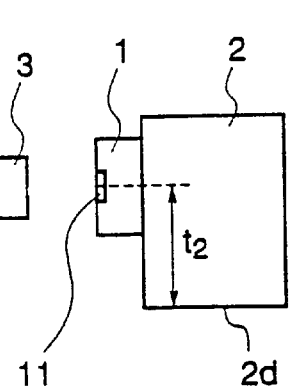
Figure 17:
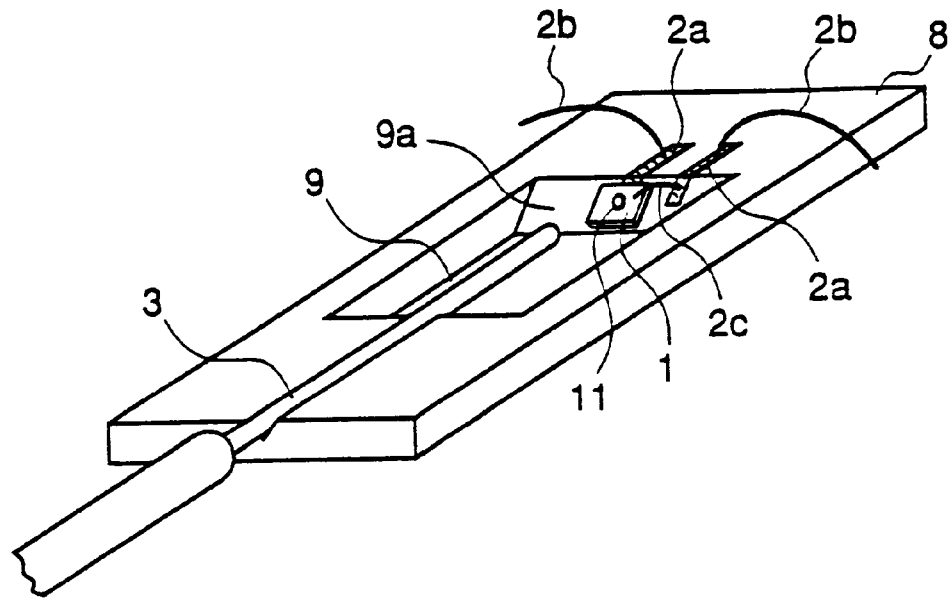
FIG. 17 is a perspective view illustrating an optical module according to a second prior art example.
Figure 18:
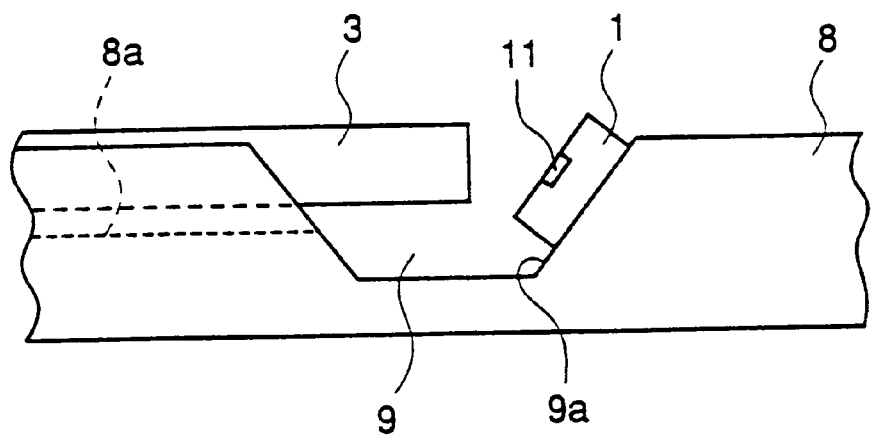
FIG. 18 is a side view of the optical module shown in FIG. 17.
Figure 19:
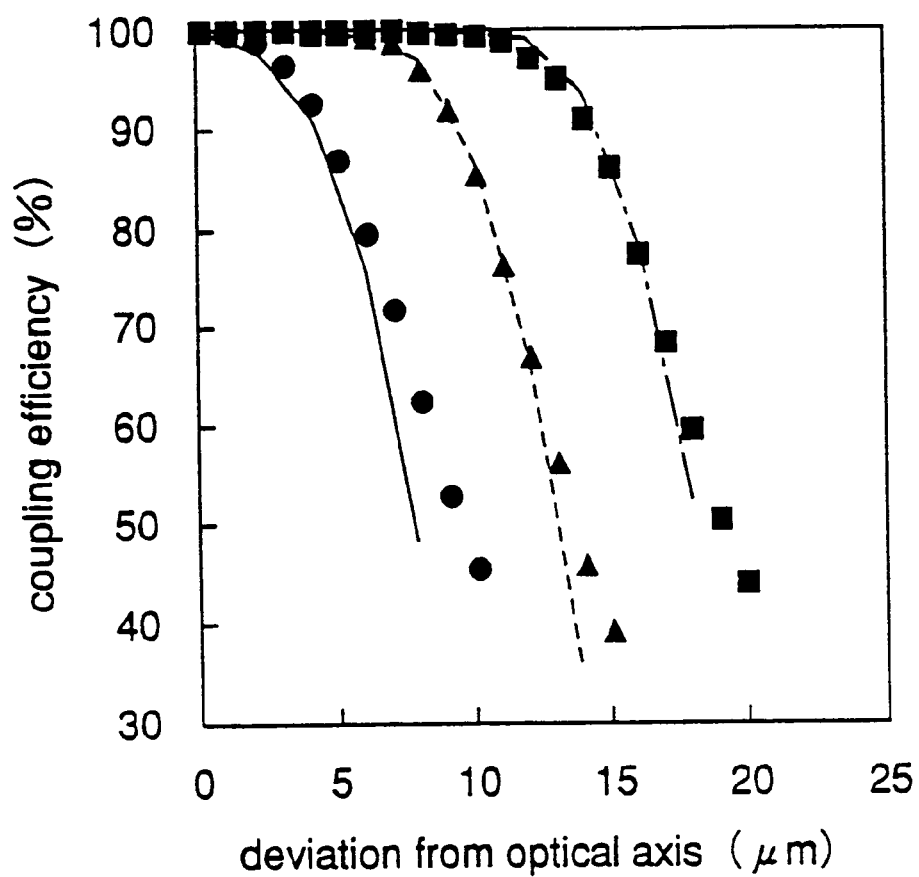
FIG. 19 is a graph showing the relationship between deviation from optical axis and coupling efficiency.
Figure 20:
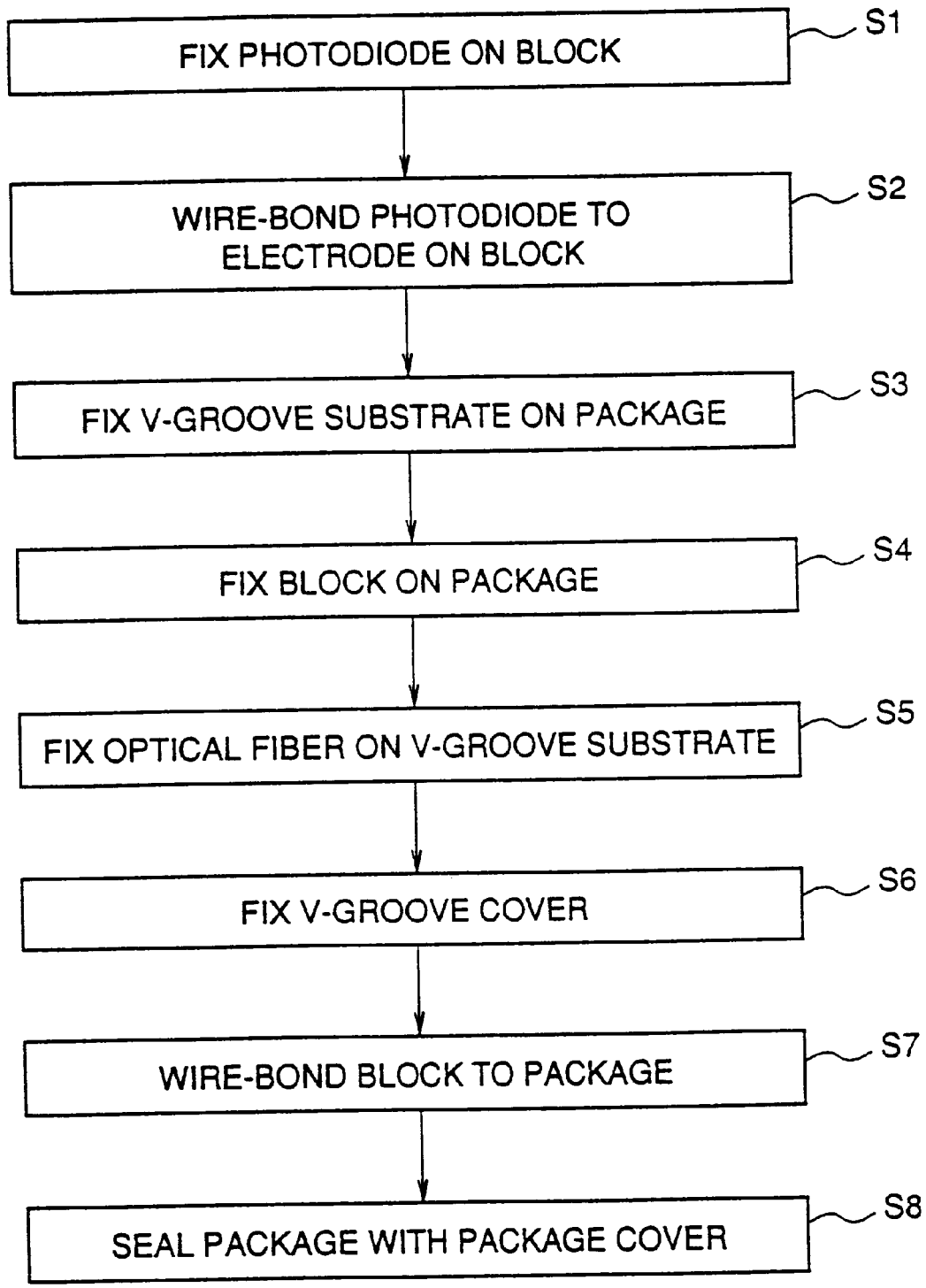
FIG. 20 is a flowchart for explaining process steps for fabricating the optical fiber module according to the first prior art example.
Figure 21:
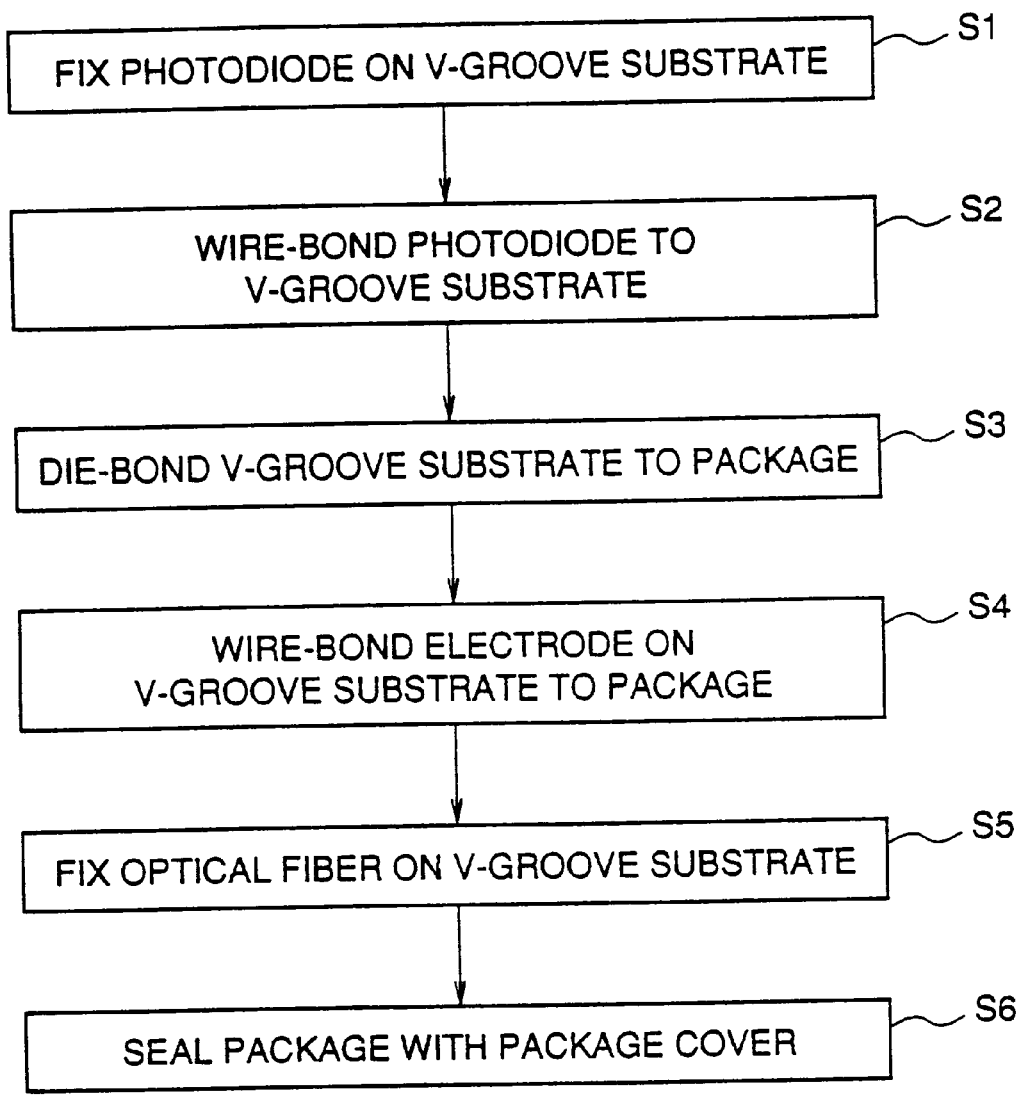
FIG. 21 is a flowchart for explaining process steps for fabricating the optical fiber module according to the second prior art example.

FIG. 14 is a perspective view illustrating an optical module according to a sixth embodiment of the present invention. In contrast with the optical modules according to the first to fifth embodiments of the invention, in the optical module according to this sixth embodiment, a surface emitting type LD (Laser Diode) or a surface emitting type LED (Light Emitting Diode) is optically coupled with an optical fiber.

As shown in FIG. 14, the optical module according to this sixth embodiment comprises a substrate 82 having an upper surface 82a and a V groove 82c for fixing an optical fiber on the upper surface 82a, an optical fiber 3 disposed in the V groove 82c on the upper surface 82a of the substrate 82, a surface emitting type LD (LED) 1a having a light emitting part 11a to be optically coupled with the optical fiber 3 on its upper surface, a block 22 on which the LD 1a is fixed so that the distance from the light emitting part 11a of the LD 1a to the lower surface 22c of the block 22 is equal to the distance from the core of the optical fiber 3 to the upper surface 82a of the substrate 82, and a lens 16 for condensing light emitted from the LD 1a.

The block 22 has a protruding part 22b on the lower surface 22c. The substrate 82 has an opening 92 for receiving the protruding part 22b of the convex block 22, and a opening 92a for receiving the condensing lens 16.

The convex block 22 is disposed on the substrate 82, with the lower surface 22c contacting the upper surface 82a of the substrate 82, the protruding part 22b being disposed in the opening 92 of the substrate 82, and the light emitting surface 11a of the LD 1a facing an end facet of the optical fiber 3.

As described above, according to the sixth embodiment of the invention, since the convex block 22 and the substrate 8 having the opening 92 that can receive the protruding part 22c of the block 22 are employed, alignment between the center of the light emitting part 11a of the LD 1a and the center of the core of the optical fiber 3 in the height direction is accurately performed, with the upper surface 82a of the substrate 82 as a reference, without being influenced by the thickness of the substrate 82. As the result, high coupling efficiency is realized between the optical fiber 3 and the surface emitting LD 1a.

What is claimed is:

1. An optical module comprising:
   a substrate having an upper surface and a groove at the upper surface;
   an optical fiber having a core and an end facet, disposed in the groove of the substrate;
   an optical semiconductor device having an upper surface and a light interactive area on the upper surface optically coupled to the optical fiber; and
   a block having a side surface on which said optical semiconductor device is fixed and a lower surface perpendicular to the side surface, wherein the light interactive area is separated from the lower surface of the block by a distance equal to separation of the core of the optical fiber from the upper surface of the substrate, and the block is disposed on the substrate with the lower surface contacting the upper surface of the substrate, so that the light interactive area is opposed to the end facet of the optical fiber.

2. The optical module of claim 1 wherein:
   said substrate has a second groove in the vicinity of the end fact of the optical fiber, said second groove being perpendicular to a longitudinal direction of the optical fiber;
   said block has a portion protruding from the lower surface and having a surface coplanar with the side surface;
   said optical semiconductor device is fixed on the protruding portion; and
   said block is disposed on the upper surface of the substrate so that the protruding portion is disposed in the second groove of the substrate and a surface of the protruding portion, opposite the surface on which the optical semiconductor device is fixed, contacts the substrate at a side surface of the second groove.

3. The optical module of claim 1 wherein:
   said substrate has an opening in the vicinity of the end facet of the optical fiber;
   said block has a portion protruding from the lower surface; and
   said block is disposed on the upper surface of the substrate so that the protruding portion of the block is disposed in the opening of the substrate.

4. The optical module of claim 1 wherein:
   said substrate has an opening in the vicinity of the end facet of the optical fiber;
   said block is rectangular in shape, and said optical semiconductor device is fixed on the side surface of the block so that a portion of the optical semiconductor device protrudes beyond the lower surface of the block; and
   said block is disposed on the upper surface of the substrate so that the protruding portion of the optical semiconductor device is disposed in the opening of the substrate.

5. The optical module of claim 1 wherein:
   said substrate has an opening in the vicinity of the end facet of the optical fiber, and sloping side surfaces in the opening;
   said block has a portion protruding from the lower surface, and the protruding portion has side surfaces that slope at the same angle as the sloping side surfaces of the substrate in the opening; and
   said block is disposed on the upper surface of the substrate so that the protruding portion is disposed in the opening of the substrate.

6. An optical module comprising:
   a substrate having an upper surface;
   an optical waveguide having a center and an end facet, disposed on the upper surface of the substrate;
   an optical semiconductor device having an upper surface and a light interactive area on the upper surface optically coupled to the optical waveguide; and
   a block having a side surface on which said optical semiconductor device is fixed and a lower surface perpendicular to the side surface, wherein the light interactive area is separated from the lower surface of the block by a distance equal to separation of the center of the optical waveguide from the upper surface of the substrate, and the block is disposed on the substrate with the lower surface contacting the upper surface of the substrate, so that the light interactive area is opposed to the end facet of the optical waveguide.

7. A method of fabricating an optical module comprising:
   preparing a substrate having, on an upper surface, a groove for fixing an optical fiber, an optical fiber having a core, an optical semiconductor device having a light interactive area on an upper surface, and a block for fixing the optical semiconductor device;
   fixing the optical semiconductor device on a side surface of the block after positioning the semiconductor device in the direction perpendicular to the surface of the substrate so that the distance from the light interactive area of the semiconductor device to the lower surface of the block is equal to the distance from the core of the optical fiber to the upper surface of the substrate when the optical fiber is disposed in the groove of the substrate;
   fixing the block on the upper surface of the substrate after positioning of the block so that the light interactive area of the semiconductor device is opposed to the groove in the substrate; and fixing the optical fiber in the groove of the substrate.

8. A method of fabricating an optical module comprising:

preparing a substrate having an upper surface, an optical waveguide having a center, an optical semiconductor device having a light interactive area on an upper surface, and a block for fixing the optical semiconductor device;

fixing the optical semiconductor device on a side surface of the block after positioning the semiconductor device in the direction perpendicular to the surface of the substrate so that the distance from the light interactive area of the semiconductor device to the lower surface of the block is equal to the distance from the center of the optical waveguide to the upper surface of the substrate when the optical waveguide is disposed on the upper surface of the substrate;

fixing the optical waveguide on the upper surface of the substrate; and fixing the block on the upper surface of the substrate after positioning of the block so that the light interactive area of the semiconductor device is opposed to the center of the optical waveguide on the substrate.

* * * * *